(12) United States Patent
Kim et al.

(10) Patent No.: US 7,855,121 B2
(45) Date of Patent: Dec. 21, 2010

(54) METHOD OF FORMING ORGANIC THIN FILM AND METHOD OF MANUFACTURING SEMICONDUCTOR DEVICE USING THE SAME

(75) Inventors: Do Hwan Kim, Seoul (KR); Sangyoon Lee, Seoul (KR); Hector Alejandro Becerril Garcia, Palo Alto, CA (US); Mark Roberts, Albuquerque, NM (US); Zhenan Bao, Stanford, CA (US); Zihong Liu, Stanford, CA (US)

(73) Assignees: Samsung Electronics Co., Ltd., Gyeonggi-do (KR); The Board of Trustees of the Laland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/382,958

(22) Filed: Mar. 27, 2009

(65) Prior Publication Data
US 2010/0248421 A1 Sep. 30, 2010

(51) Int. Cl.
*H01L 21/20* (2006.01)
(52) U.S. Cl. ............... 438/384; 438/149; 438/781; 438/782; 257/E21.051; 257/E21.094; 257/E21.266; 257/E21.267; 257/E21.278; 257/E21.4; 257/E21.411

(58) Field of Classification Search ............ 438/384, 438/149, 381, 584, 782, 725, 789, 790; 257/E21.051, 257/E21.094, E21.266, E21.267, E21.278, 257/E21.004, E21.411
See application file for complete search history.

(56) References Cited

U.S. PATENT DOCUMENTS

| 6,203,933 | B1 * | 3/2001 | Nakaya et al. | 428/690 |
|---|---|---|---|---|
| 7,061,010 | B2 * | 6/2006 | Minakata | 257/40 |
| 2007/0243658 | A1 * | 10/2007 | Hirai et al. | 438/99 |
| 2007/0262308 | A1 * | 11/2007 | Song | 257/59 |
| 2007/0272653 | A1 * | 11/2007 | Wakita | 216/13 |
| 2009/0111210 | A1 * | 4/2009 | Obuchi et al. | 438/99 |

* cited by examiner

*Primary Examiner*—David Nhu
(74) *Attorney, Agent, or Firm*—Harness, Dickey & Pierce, P.L.C.

(57) ABSTRACT

Provided are a method of forming an organic semiconductor thin film and a method of manufacturing a semiconductor device using the. According to example embodiments, a method of forming an organic semiconductor thin film at least may include exposing a lower substrate coated with an organic semiconductor solution using a method of generating a shearing stress to the portion of the lower substrate coated with the organic semiconductor solution. A guide structure may be formed adjacent to the organic semiconductor solution.

20 Claims, 9 Drawing Sheets db − P2TP dho − P3TP dbo − P2TP

TMS − 4T dho − P2TP

TMS − P2TP

US 7,855,121 B2

METHOD OF FORMING ORGANIC THIN FILM AND METHOD OF MANUFACTURING SEMICONDUCTOR DEVICE USING THE SAME

BACKGROUND

1. Field

Example embodiments relate to a method of manufacturing a semiconductor device, and more particularly, to a method of manufacturing a semiconductor device using a method of forming an organic semiconductor thin film.

2. Description of the Related Art

The properties of organic thin film transistors (OTFTs) using a crystalline organic semiconductor as a channel material may be improved by controlling the electrical properties and interfacial fine structure between the crystalline organic semiconductor and an electrode and the electrical properties and interfacial fine structure between the crystalline organic semiconductor and an insulator.

Channel layers of OTFTs may be formed by a spin-coating method, a drop-casting method, a bar coating method, or a dip-coating method. In a recent development, organic semiconductor channel layers may be coated on a desired location of TFTs by a zone-casting method or an ink-jet printing method.

However, when the methods mentioned above are used, manufacturing organic semiconductor nano thin films having the desired degree of molecular orientation may be difficult. By using a doctor-blade method, or a rubbing method, an organic semiconductor nano thin film having some degree of molecular orientation may be formed. In example embodiments, however, forming an organic semiconductor nano thin film using a weak solution may be difficult.

FIG. 7 is a polarization microscopic image of an organic semiconductor thin film formed using a conventional spin-coating method. FIG. 8 is a polarization microscopic image of an organic semiconductor thin film formed using a conventional drop-casting method.

Referring to FIGS. 7 and 8, relatively light areas 57 and 59 represent crystalline arrangement of the organic semiconductor thin films, respectively. In FIGS. 7 and 8, the organic semiconductor thin films are partially crystallized, but considering the whole area of the organic semiconductor thin film, most of the crystals of the organic semiconductor thin films are irregularly arranged. In FIG. 8, a reference number 60 denotes a source electrode and a drain electrode, which are disposed on the organic semiconductor thin film.

SUMMARY

Example embodiments include a method of forming an organic semiconductor thin film in which the regular crystalline orientation may be obtained on an entire area on which the organic semiconductor thin film is to be formed by finely adjusting the crystalline orientation, and a method of manufacturing a organic thin film transistor (OTFT) using the method of forming the organic semiconductor thin film.

According to example embodiments, a method of forming an organic semiconductor thin film may include coating an organic semiconductor solution on a portion of a lower substrate; providing an upper substrate on the portion of the lower substrate coated with the organic semiconductor solution; and moving the upper substrate in a direction for generating a shear stress on the portion of the lower substrate coated with the organic semiconductor solution in order to expose the portion of the lower substrate coated with the organic semiconductor solution.

The method may further include forming a guide structure adjacent to the portion of the lower substrate coated with the organic semiconductor solution. Moving the upper substrate may further include heating the lower substrate. Prior to coating the organic semiconductor solution, the method may further include modifying a surface of the lower substrate with a hydrophilic material. Prior to providing an upper substrate on the portion of the lower substrate coated with the organic semiconductor solution, the method may further include modifying the upper substrate with a hydrophobic material.

The lower substrate may include a semiconductor substrate and an insulating layer sequentially stacked. A moving velocity of the upper substrate may be determined by the conditions of heating the lower substrate and a boiling point of a solvent of the organic semiconductor solution. The insulating layer may include an organic insulating layer or an inorganic insulating layer. Prior to moving the upper substrate, the method may further include heating the lower substrate, wherein during moving the upper substrate, the heating of the lower substrate is stopped. The lower substrate may be heated by a hot plate below the lower substrate. The organic semiconductor solution may include one selected from the group consisting of db-P2TP, dbo-P2TP, dho-P2TP, dho-P3TP, TMS-P2TP, TMS-4T and a mixture thereof, as an organic semiconductor material. The moving velocity of the upper substrate may be about 6 to about 60 mm/min.

According to example embodiments, a method of manufacturing an organic thin film transistor (OTFT) may include providing a source, a drain, a channel, a gate insulating layer and a gate on a lower substrate, wherein the channel includes an organic semiconductor thin film formed by the method including coating an organic semiconductor solution on a portion of the lower substrate; providing an upper substrate on the portion of the lower substrate coated with the organic semiconductor solution; and moving the upper substrate in a direction for generating a shear stress on the portion of the lower substrate coated with the organic semiconductor solution in order to expose the portion of the lower substrate coated with the organic semiconductor solution.

The lower substrate may include the gate and the gate insulating layer sequentially stacked. The method may further include sequentially stacking the gate insulating layer and the gate on the channel.

BRIEF DESCRIPTION OF THE DRAWINGS

Example embodiments will be more clearly understood from the following detailed description taken in conjunction with the accompanying drawings.

FIG. 1 is a cross-sectional view for explaining a method of forming an organic semiconductor thin film, according to example embodiments;

FIG. 2 illustrates chemical structures of six kinds of organic semiconductor materials used as a material of the organic semiconductor thin film of FIG. 1;

FIGS. 3 through 6 are enlarged views of first through fourth regions illustrated in FIG. 1, respectively;

FIG. 7 is a polarization microscopic image of an organic semiconductor thin film formed using a general spin-coating method;

FIG. 8 is a polarization microscopic image of an organic semiconductor thin film formed using a general drop-casting method;

FIGS. 9 and 10 are polarization microscopic images of organic semiconductor thin films formed using a method of forming an organic semiconductor thin film, according to example embodiments;

FIG. 11 is a series of cross-sectional views illustrating a method of manufacturing an organic thin film transistor (OTFT) having a bottom gate, according to example embodiments;

FIG. 12 is a cross-sectional view for explaining a method of manufacturing an organic thin film transistor (OTFT) having a top gate, according to example embodiments; and FIGS. 13-15 are graphs illustrating operation properties of an OTFT formed using a method of manufacturing OTFT according to example embodiments.

Figure 1:
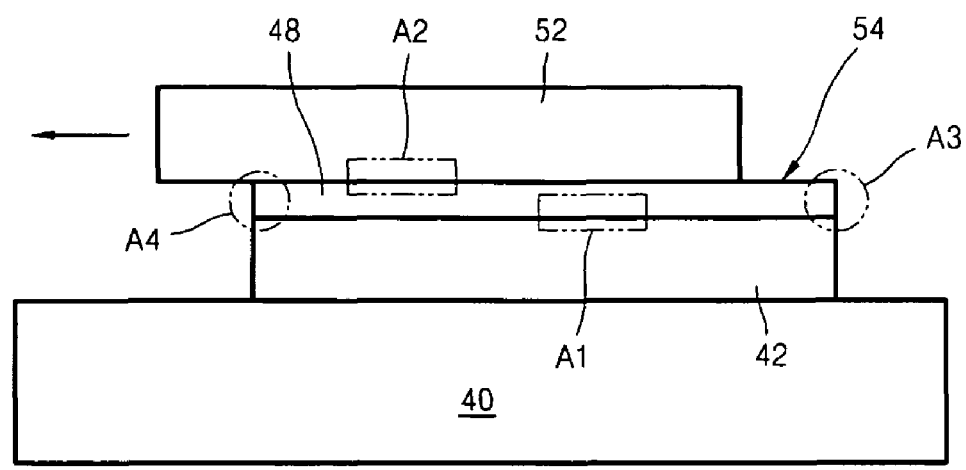
FIGS. 1-15 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a method of forming an organic semiconductor thin film and a method of manufacturing an organic thin film transistor (OTFT) using the same will be described with reference to the attached drawings. In the drawings, the thicknesses of layers and regions are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A method of forming an organic semiconductor thin film according to example embodiments will be described with reference to FIG. 1. Referring to FIG. 1, a lower substrate 42 may be disposed on a hot plate 40. While forming the organic semiconductor thin film, the hot plate 40 may maintain the temperature of the lower substrate 42 at a predetermined or given temperature, for example, a temperature of about 25 to about 100° C. The lower substrate 42 may be fixed onto the hot plate 40. An organic semiconductor solution 48 may be coated on the lower substrate 42. The organic semiconductor solution 48 may be a relatively weak solution. For example, the concentration of the organic semiconductor solution 48 may be about 1 to about 10 mg/ml. The organic semiconductor solution 48 may include an organic semiconductor material and a solvent. The solvent may be a volatile material that volatilizes at a predetermined or given temperature. The solvent may be (1,2-dichlorobenzene), (1,2,4-trichlorobenzene), or chlorobenzene. The organic semiconductor material may be one selected from the group consisting of db-P2TP, dbo-P2TP, dho-P2TP, dho-P3TP, TMS-P2TP, TMS-4T and a mixture thereof.

Figure 2:
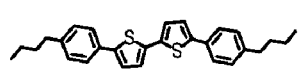
Figure 2:
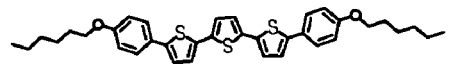
Figure 2:
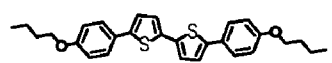
Figure 2:
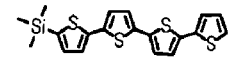
Figure 2:
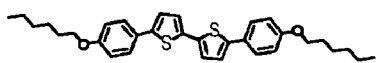
Figure 2:
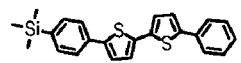

FIG. 2 illustrates chemical structures of these organic semiconductor materials. After coating the organic semiconductor solution 48 on the lower substrate 42, an upper substrate 52 may be disposed to cover or on the lower substrate 42 coated with the organic semiconductor solution 48. Thus, a lower surface of the upper substrate 52 may come in contact with the organic semiconductor solution 48. The upper substrate 52 may be one of a plurality of shearing means for generating a shear stress to the coated organic semiconductor solution 48 on the lower substrate 42. After the upper substrate 52 is formed, the upper substrate 52 may be moved in a predetermined or given horizontal direction. The upper substrate 52 may be moved in a direction parallel to an upper surface of the lower substrate 42. For convenience of description, the upper substrate 52 may be moved in a direction indicated by an arrow illustrated in FIG. 1. A moving velocity of the upper substrate 52 may vary according to a material of the organic semiconductor solution 48. For example, the moving velocity of the upper substrate 52 may be about 6 to about 60 mm/min.

A portion of the coated organic semiconductor solution 48 on the lower substrate 42 may be exposed by the movement of the upper substrate 52. A solvent may be volatilized from an exposed portion 54 of the coated organic semiconductor solution 48 on the lower substrate 42, and a seed film (not shown) may be formed in the exposed portion 54. The seed film may include multiple crystal grains. The multiple crystal grains may function as a nucleation site with respect to the organic semiconductor solution 48 that continues to be exposed while the upper substrate 52 is being moved. Thus, because the seed film extends in a direction in which the upper substrate 52 is moved, the organic semiconductor thin film may be formed on the upper surface of the lower substrate 42.

While the coated organic semiconductor solution 48 on the lower substrate 42 is gradually being exposed during the movement of the upper substrate 52, the solvent may be volatilized directly from the exposed portion 54 of the coated organic semiconductor solution 48 of the lower substrate 42 and the seed film may be formed in the exposed portion 54. To achieve this, if necessary, the lower substrate 42 may be heated while considering the boiling point of the solvent. For example, if the boiling point of the solvent is high and the lower substrate 42 is not heated, after the coated organic semiconductor solution 48 of the lower substrate 42 begins to be exposed, the volatilization of the solvent may be delayed or may not occur from the exposed portion 54 of the coated organic semiconductor solution 48 on the lower substrate 42.

Thus, if the boiling point is high, the lower substrate 42 may be heated so that the solvent may be volatilized directly from the exposed portion 54 immediately after the coated organic semiconductor solution 48 on the lower substrate 42 begins to be exposed. To achieve this, the hot plate 40 may be used to heat the lower substrate 42 to the above temperature, that is, a temperature of about 25 to about 100° C. In addition, the solvent may be volatilized directly from the exposed portion 54 of the coated organic semiconductor solution 48 on the lower substrate 42 by controlling the moving velocity of the upper substrate 52 according to the volatility of the solvent. For example, if the volatility of the solvent included in the organic semiconductor solution 48 is relatively high at a predetermined or given temperature, even if the moving velocity of the upper substrate 52 is high, the solvent may be volatilized directly from the exposed portion 54 of the coated organic semiconductor solution 48 on the lower substrate 42.

On the other hand, if the volatility of the solvent is relatively low at a predetermined or given temperature, the solvent may be sufficiently volatilized from the exposed portion 54 of the coated organic semiconductor solution 48 on the lower substrate 42 by moving the upper substrate 52 at a relatively low moving velocity. Thus, by adjusting the moving velocity of the upper substrate 52, that is, the shear stress, the crystalline orientation of the organic semiconductor thin film may be finely adjusted. Thus, the crystalline structure of the organic semiconductor thin film may be variously changed. In addition, because the organic semiconductor material is used in a solution state, various morphologies may be obtained by adjusting the boiling point of the solvent and changing the polarity of the solvent.

Accordingly, in the method of forming the organic semiconductor thin film according to example embodiments, a self-assembled organic semiconductor nano thin film having a predetermined or given orientation may be formed on surfaces of inorganic and organic insulators by applying a shear stress to a solution including an organic semiconductor material. In addition, the molecular orientation and nano structure of the organic semiconductor nano thin film may be finely adjusted by adjusting the volatility of the solvent and the shear stress. Thus, when an organic semiconductor nano thin film formed using the method of forming the organic semiconductor thin film is used as a channel of an OTFT, the mobility of the OTFT may increase, which will be described later. In addition, because the method of forming the organic semiconductor thin film according to example embodiments may adjust the crystalline orientation and crystallization degree of a high molecular semiconductor material formed on the surface of an insulating film, when the organic semiconductor nano thin film formed using the method of forming the organic semiconductor thin film according to an exemplary embodiment is used as a channel of an OTFT, the contact resistance between a channel and source/drain may also be adjusted.

Figure 3:
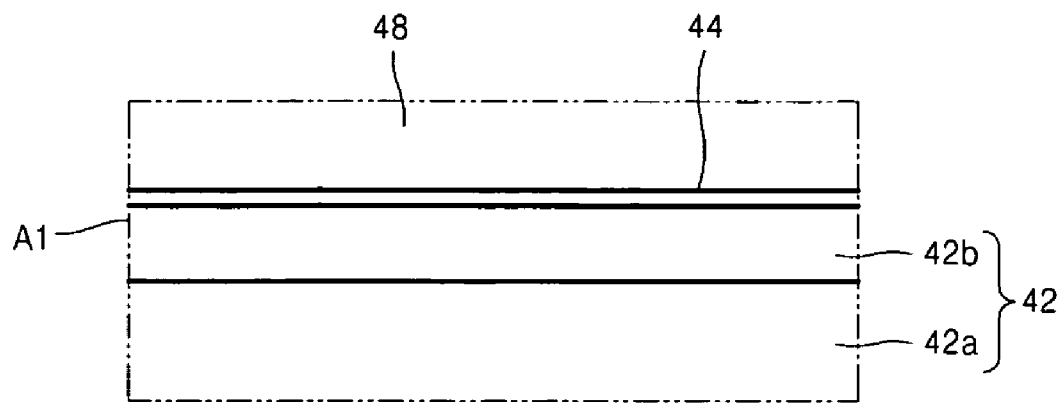

FIGS. 3-6 are enlarged views of first through fourth regions A1 through A4 illustrated in FIG. 1, respectively. Referring to FIG. 3, a thin hydrophilic material layer 44 may be coated on the upper surface of the lower substrate 42. To achieve this, a surface of the lower substrate 42 on which the organic semiconductor solution 48 is to be coated may be modified with a hydrophilic material, prior to coating the organic semiconductor solution 48 on the lower substrate 42 disposed on the hot plate 40. In example embodiments, the hydrophilic material may be phenyltriethoxy silane (PTS), poly(4-vinyl-phenol)(PVP)2, or octadecyltrimethoxysilane (OTS).

When a surface of the lower substrate 42 is modified with a hydrophilic material, the hydrophilic material layer 44 may be formed on the surface of the lower substrate 42. Alternatively, molecules of the hydrophilic material instead of a layer may be attached to the surface of the lower substrate 42. The lower substrate 42 may include an electrode substrate 42a and an insulating layer 42b, which are sequentially deposited. The electrode substrate 42a may be a silicon substrate, or alternatively, may be a different kind of electrode substrate. The insulating layer 42b may be an organic insulating layer or an inorganic insulating layer. For example, the organic insulating layer may be a poly-4-vinylphenol (PVP) layer, and the inorganic insulating layer may be a $SiO_2$ layer.

Figure 4:
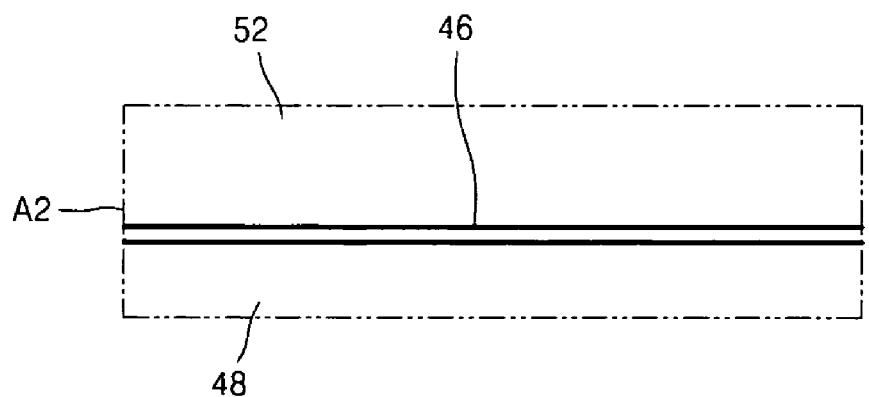

Referring to FIG. 4, a lower surface of the upper substrate 52 may be covered with a hydrophobic material layer 46. Prior to providing the upper substrate 52 on the coated organic semiconductor solution 48 on the lower substrate 42, the lower surface of the upper substrate 52, which contacts the organic semiconductor solution 48, may be modified with a hydrophobic material, thereby forming the hydrophobic material layer 46. When the lower surface of the upper substrate 52 is modified with a hydrophobic material, the hydrophobic material layer 46 may be formed on the lower surface of the upper substrate 52. Example embodiments are not limited thereto, and alternatively, molecules of the hydrophobic material instead of the hydrophobic material layer 46 may be attached to the lower surface of the upper substrate 52. The hydrophobic material may be (tridecafluoro-1) or (1,2,2-tetrahydrotrichlorosilane).

As illustrated in FIGS. 3 and 4, a surface of the lower substrate 42 may be modified with a hydrophilic material, prior to coating the organic semiconductor solution 48 on the lower substrate 42, and a surface of the upper substrate 52 may be modified with a hydrophobic material, prior to providing the upper substrate 52 on the coated organic semiconductor solution 48 on the lower substrate 42. As a result of the modifications, the coated organic semiconductor solution 48 on the lower substrate 42 may not be attached to the upper substrate 52 and may not be separated from the lower substrate 42 during the movement of the upper substrate 52. Thus, processes of forming the organic semiconductor thin film may be stably performed.

Figure 5:
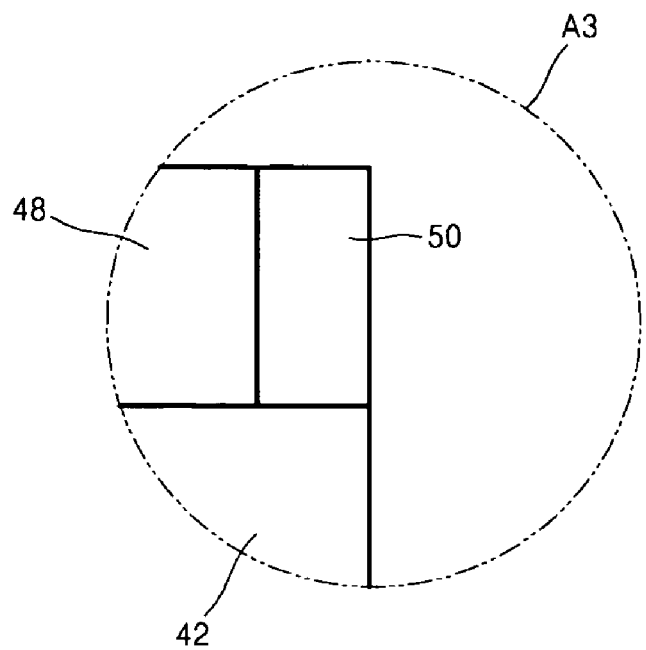
Figure 6:
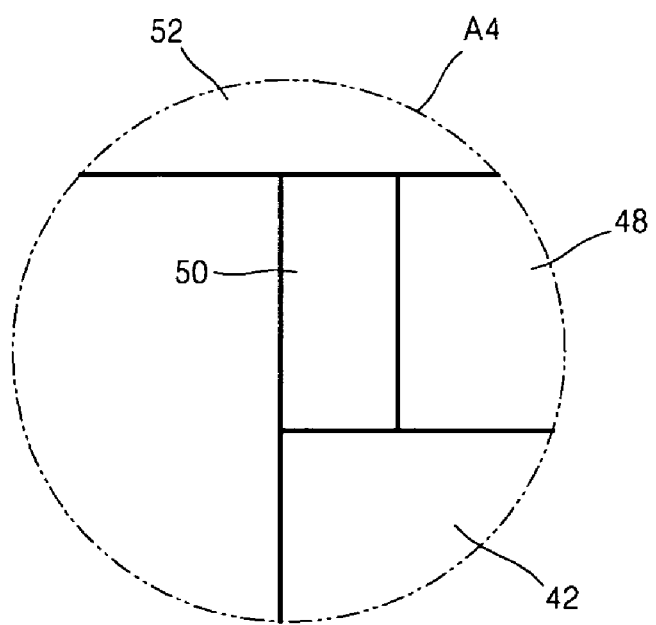

Referring to FIGS. 5 and 6, a guide structure 50 may be disposed on an edge region of the lower substrate 42. The guide structure 50 may accommodate the coated organic semiconductor solution 48 on the lower substrate 42. That is, when the upper substrate 52 is provided on the coated organic semiconductor solution 48 on the lower substrate 42, the guide structure 50 may prevent or reduce the organic semiconductor solution 48 from leaking in a lateral direction. In addition, the guide structure 50 may affect the thickness of the organic semiconductor thin film. That is, when the height of the guide structure 50 is increased, because the thickness of the organic semiconductor solution 48 coated on the lower substrate 42 is increased, the thickness of the organic semiconductor thin film may be increased. On the other hand, when the height of the guide structure 50 is reduced, the thickness of the organic semiconductor thin film may be reduced. A surface of the guide structure 50, particularly, an inner surface of the guide structure 50, which contacts the organic semiconductor solution 48, may be modified with a hydrophilic material, as in the surface of the lower substrate 42. Also, in the case of FIGS. 5 and 6, the structure of the lower substrate 42 may the same as that of FIG. 3.

Figure 7:
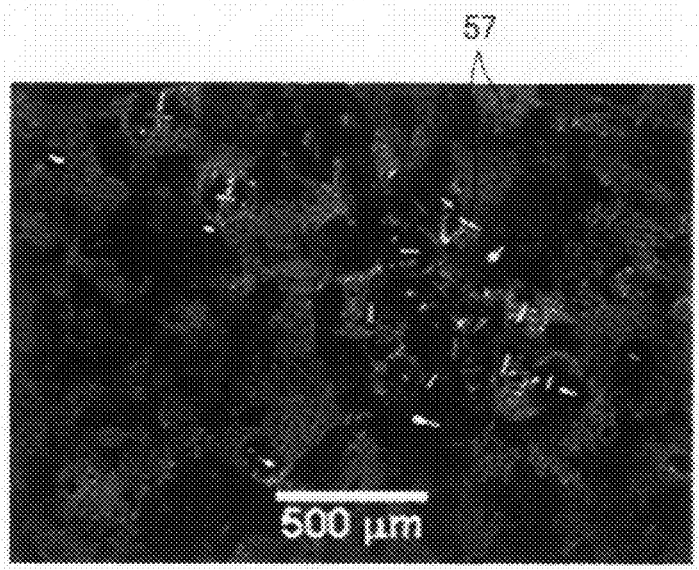
Figure 8:
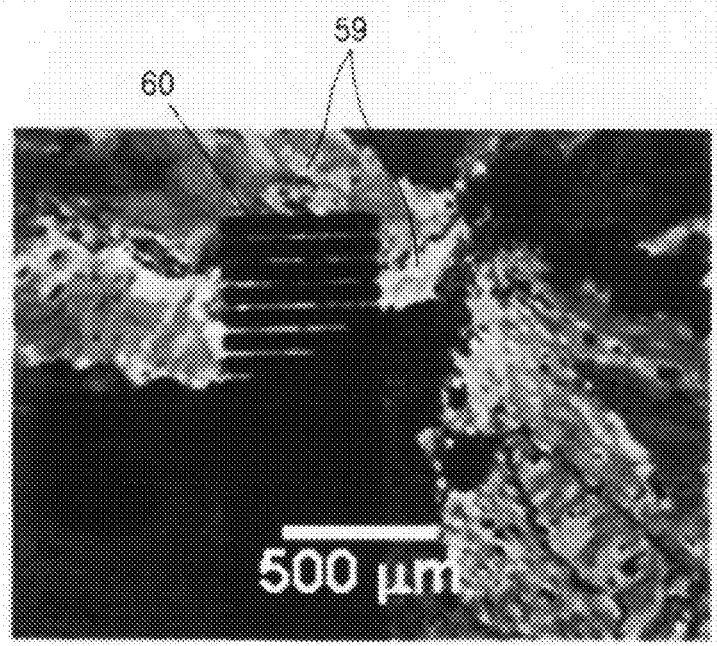

When the organic semiconductor thin film is formed using the method of forming the organic semiconductor thin film as described with reference to in FIG. 1, crystals of the organic semiconductor thin film may be regularly arranged in a predetermined or given direction. The method of forming the organic semiconductor thin film according to example embodiments may be different from a conventional doctor-blade method in that the method according to example embodiments uses a relatively weak organic semiconductor solution. The organic semiconductor thin film formed using the method of example embodiments may be different from a nano-sized thin film formed using a general spin-coating method or a drop-casting method in terms of morphology. The morphology difference is illustrated in FIGS. 7 through 9.

Figure 9:
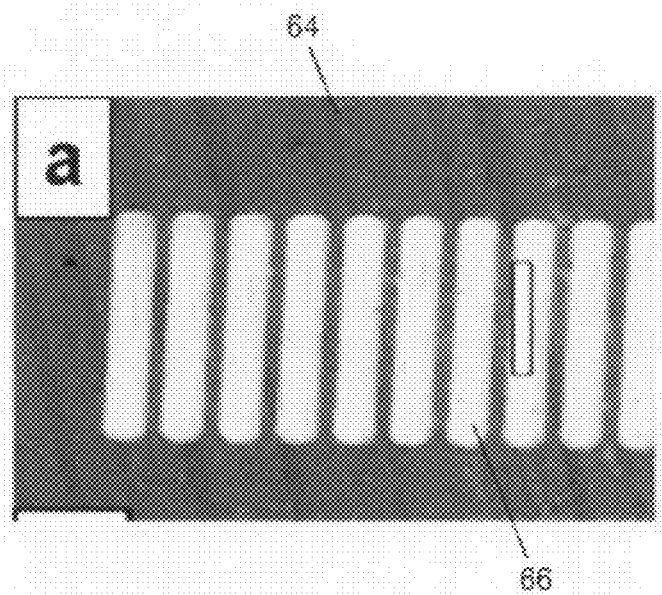
Figure 10:
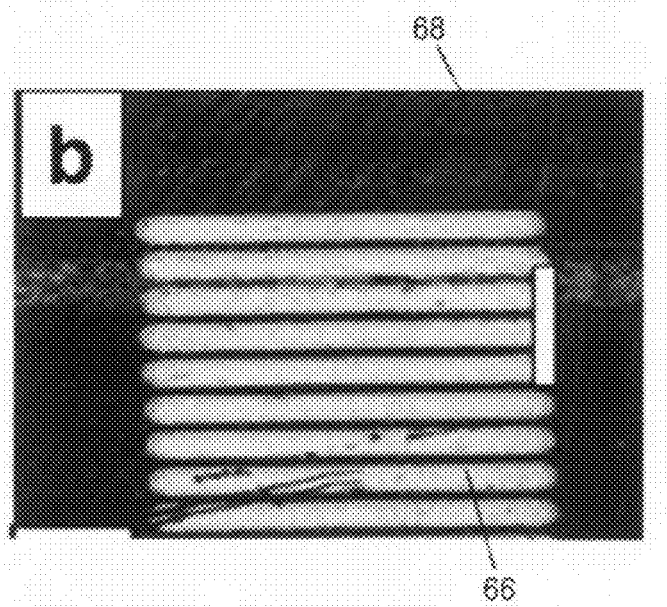

FIGS. 9 and 10 are polarization microscopic images of organic semiconductor thin films 64 and 68 formed using a method of forming an organic semiconductor thin film, according to example embodiments.

Referring to FIGS. 9 and 10, the organic semiconductor thin films 64 and 68 have only a crystal orientation in a predetermined or given direction. In FIGS. 9 and 10, a reference number 66 denotes a source electrode and a drain electrode, which are disposed on each of the organic semiconductor thin films 64 and 68. The organic semiconductor thin film 64 of FIG. 9 is a nano thin film, and may be formed on an inorganic insulating layer ($SiO_2$), whose surface is modified, that is, a surface thereof is modified with a hydrophilic material. Also, the organic semiconductor thin film 68 of FIG. 10 is a nano thin film, and may be formed on an organic insulating layer (PVP), whose surface is modified. From FIGS. 9 and 10, an organic semiconductor thin film formed using the method according to example embodiments has improved crystalline orientation as a whole regardless of whether the organic semiconductor thin films 64 and 68 are formed on an inorganic insulating layer or an organic insulating layer.

Figure 11:
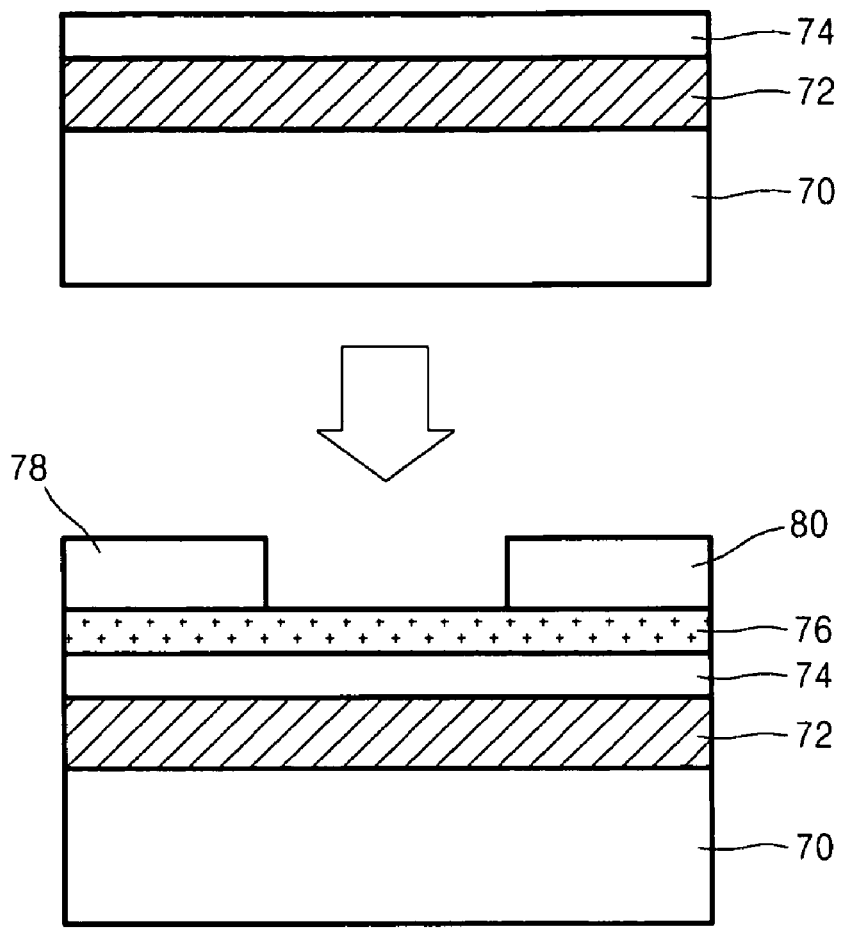

A method of manufacturing an OTFT according to example embodiments will be described. FIG. 11 is a series of cross-sectional views illustrating a method of manufacturing a bottom gate OTFT, according to example embodiments. Referring to FIG. 11, a gate 72 may be formed on a lower substrate 70. A gate insulating layer 74 may be formed on the gate 72. The gate insulating layer 74 may be an inorganic or organic insulating layer. For example, the gate insulating layer 74 may be a $SiO_2$ layer or a PVP layer. An organic semiconductor thin film 76 may be formed on the gate insulating layer 74.

The organic semiconductor thin film 76 may be formed of one of the organic semiconductor materials illustrated in FIG. 2, for example, 4-thiophene-trimethylsilane (4TTMS). The organic semiconductor thin film 76 may be used as a channel layer. The organic semiconductor thin film 76 may be formed using the method of forming the organic semiconductor thin film described with reference to FIG. 1. For example, a guide structure may be formed on an edge of the gate insulating layer 74, and an organic semiconductor solution may be coated on the gate insulating layer 74. Prior to coating the organic semiconductor solution, a surface of the guide structure and a surface of the gate insulating layer 74 may be modified with a hydrophilic material.

The organic semiconductor solution may be covered with a layer, e.g., an upper substrate, for covering the organic semiconductor solution, wherein a surface of the upper substrate may be modified with a hydrophobic material. In a situation where the upper substrate contacts the organic semiconductor solution, the upper substrate may be moved in a predetermined or given direction for generating a shear stress to the organic semiconductor solution. The upper substrate may be moved at a predetermined or given velocity by using a moving means, for example, a step motor. During the movement of the upper substrate, the substrate 70 playing a role as a lower substrate may be heated. The moving velocity of the upper substrate may be determined considering the boiling point of a solvent of the organic semiconductor solution and a heating temperature of the substrate 70. When the movement of the upper substrate is completely performed, the guide structure and the upper substrate may be removed. Source and drain electrodes 78 and 80 may be formed on the organic semiconductor thin film 76 so as to be spaced apart from each other, thereby completing the manufacture of a bottom gate OTFT.

Figure 12:
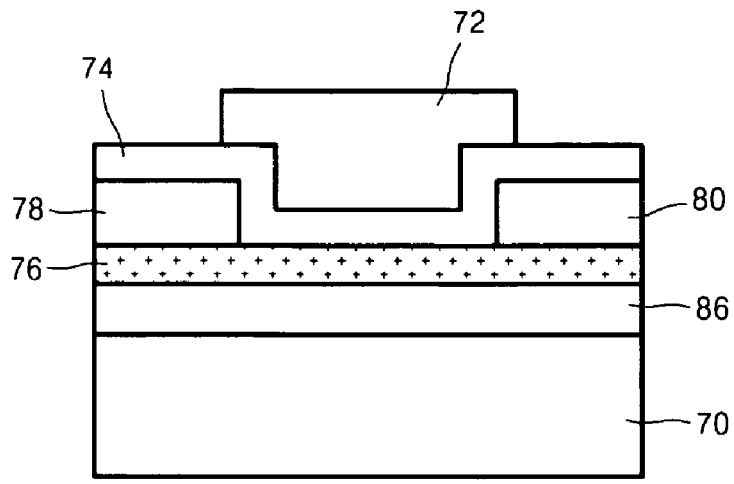

FIG. 12 is a cross-sectional view for explaining a method of manufacturing a top gate OTFT, according to example embodiments. Referring to FIG. 12, an insulating layer 86 may be formed on a substrate 70. The insulating layer 86 may be an organic or inorganic insulating layer. A surface of the insulating layer 86 may be modified with a hydrophilic material. An organic semiconductor thin film 76 as a channel layer may be formed on the insulating layer 86. The organic semiconductor thin film 76 may be formed using the method illustrated in FIG. 11. Source and drain electrodes 78 and 80 may be formed on the organic semiconductor thin film 76 so as to be spaced apart from each other. A gate insulating layer 74 may be formed on the organic semiconductor thin film 76 and may be formed on the source and drain electrodes 78 and 80. A gate 72 may be formed on the gate insulating layer 74 between the source and drain electrodes 78 and 80, thereby completing the manufacture of a top gate OTFT.

Figure 13:
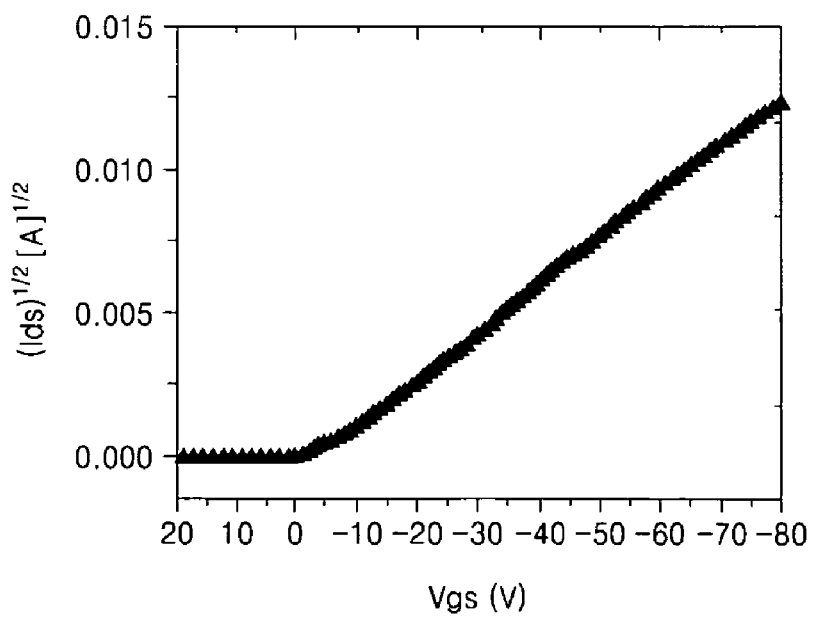
Figure 14:
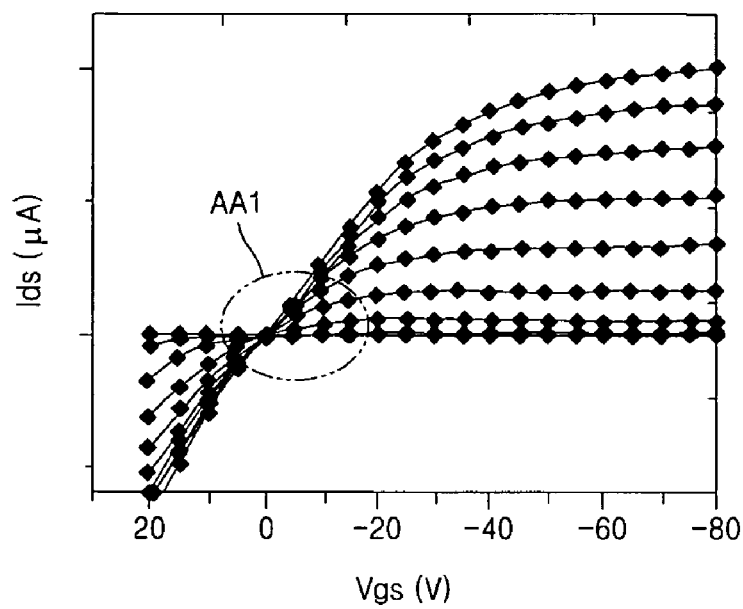
Figure 15:
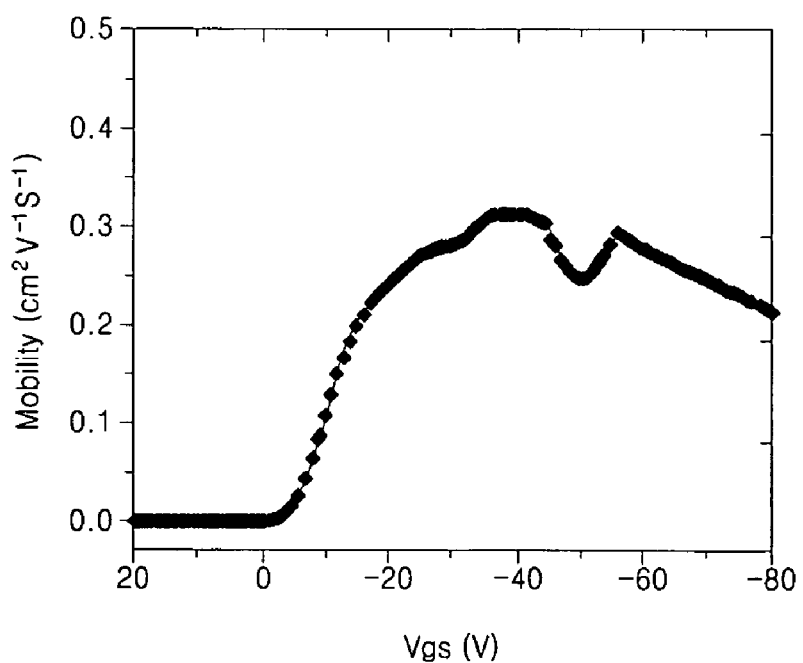

FIGS. 13-15 are graphs illustrating operation properties of an OTFT formed using a method of manufacturing an OTFT according to example embodiments. FIG. 13 is a graph illustrating a source-drain current Ids with respect to a gate voltage Vgs. FIG. 14 is a graph illustrating a source-drain current Ids with respect to a drain voltage Vds. FIG. 15 is a graph illustrating carrier mobility with respect to a gate voltage Vgs.

The carrier mobility may be measured from the slope of the graph of FIG. 13, or with reference to the graph FIG. 15. Referring to FIGS. 13 and 15, the carrier mobility of the OTFT formed using the method of manufacturing an OTFT according to example embodiments is about 0.1 to 0.3($cm^2V^{-1}S^{-1}$). Referring to FIG. 13, considering that the vertical axis represents the square root of a source-drain current Ids, an ON/OFF ratio of the OTFT may be about $10^5$ to about $10^7$. Graphs of FIG. 14 illustrate the source-drain current Ids with respect to different gate voltages Vgs. In a predetermined or given period AA1, each graph of FIG. 14 is a straight line, and a pinch off appears at each graph when a drain voltage Vds is increased. Thus, ohmic contact is generated between the source and drain electrodes 78 and 80 and the organic semiconductor thin film 76 of the OTFT formed using the method of manufacturing OTFT according to example embodiments.

Table 1 shows operation properties of organic thin film transistors where their channel layers are formed by two different methods. In the first method, organic semiconductor thin films used as the channel layers of the organic thin film transistors are formed using the method described with reference to FIG. 1, that is, using shearing stress. In the second method, the organic semiconductor thin films are formed using general drop-casting and spin coating methods, respectively.

TABLE 1

| Method of depositing organic semiconductor thin film | Mobility ($cm^2V^{-1}S^{-1}$) | On/Off Ratio |
| --- | --- | --- |
| drop casting | 0.03-0.06 | $10^3$-$10^4$ |
| spin coating | 0.005-0.08 | 300-500 |
| Shearing stress | 0.1-0.3 | $10^5$-$10^7$ |

As shown in Table 1, mobility of the organic semiconductor thin film formed by shearing stress, that is, using the method according to example embodiments, is greater compared to one of the organic semiconductor thin film formed by a drop-casting method or a spin-coating method. In addition, when shearing stress is used to form the organic semiconductor thin film, the ON/OFF ratio of the OTFT is greater compared to where a drop-casting method or a spin-coating method is used to form the organic semiconductor thin film.

It should be understood that example embodiments described herein should be considered in a descriptive sense only and not for purposes of limitation. For example, other types of organic semiconductor thin film in addition to the above-described organic semiconductor thin film may also be formed by shearing stress. A method of forming an organic semiconductor thin film by using shearing stress may be used to manufacture other electronic devices as well as OTFTs. In addition, during the formation of an organic semiconductor thin film, if the time taken to move an upper substrate is relatively short, an appropriate temperature of a lower substrate may be maintained only by heating the lower substrate prior to moving the upper substrate. Thus, during the movement of the upper substrate, the lower substrate may not be required to be heated. Descriptions of features within example embodiments should typically be considered as available for other similar features or aspects in other example embodiments.

What is claimed is:

1. A method of forming an organic semiconductor thin film (OTF), the method comprising:
    coating an organic semiconductor solution on a portion of a lower substrate;
    providing an upper substrate on the portion of the lower substrate coated with the organic semiconductor solution; and
    moving the upper substrate in a direction for generating a shear stress to the organic semiconductor solution to expose the organic semiconductor solution.

2. The method of forming the OTF according to claim 1, further comprising;
    forming a guide structure adjacent to the portion of the lower substrate to be coated with the organic semiconductor solution.

3. The method of forming the OTF according to claim 1, further comprising:
    heating the lower substrate.

4. The method of forming the OTF according to claim 1, wherein prior to coating the organic semiconductor solution, the method further comprising:
    modifying a surface of the lower substrate with a hydrophilic material.

5. The method of forming the OTF according to claim 1, wherein prior to providing an upper substrate on the portion of the lower substrate coated with the organic semiconductor solution, the method further comprising:
    modifying the upper substrate with a hydrophobic material.

6. The method of forming the OTF according to claim 1, wherein the lower substrate comprises a semiconductor substrate and an insulating layer sequentially stacked.

7. The method of forming the OTF according to claim 1, wherein a moving velocity of the upper substrate is determined by the conditions of heating the lower substrate and a boiling point of a solvent of the organic semiconductor solution.

8. The method of forming the OTF according to claim 6, wherein the insulating layer comprises an organic insulating layer or an inorganic insulating layer.

9. The method of forming the OTF according to claim 1, wherein prior to moving the upper substrate, the method further comprising:
    heating the lower substrate, wherein during moving the upper substrate, the heating of the lower substrate is stopped.

10. The method of forming the OTF according to claim 1, wherein the lower substrate is heated by a hot plate below the lower substrate.

11. The method of forming the OTF according to claim 1, wherein the organic semiconductor solution comprises one selected from the group consisting of db-P2TP, dbo-P2TP, dho-P2TP, dho-P3TP, TMS-P2TP, TMS-4T and a mixture thereof, as an organic semiconductor material.

12. The method of forming the OTF according to claim 7, wherein the moving velocity of the upper substrate is about 6 to about 60 mm/min.

13. A method of manufacturing an organic thin film transistor (OTFT) comprising:
 providing a source, a drain, a channel, a gate insulating layer and a gate on a lower substrate, wherein the channel includes an organic semiconductor thin film formed by the method including:
  coating an organic semiconductor solution on a portion of the lower substrate;
  providing an upper substrate on the portion of the lower substrate coated with the organic semiconductor solution; and
  moving the upper substrate in a direction for generating a shear stress to the organic semiconductor solution coated on the lower substrate to expose the coated organic semiconductor solution.

14. The method of manufacturing the OTFT according to claim 13, further comprising:
 forming a guide structure adjacent to the portion of the lower substrate to be coated with the organic semiconductor solution.

15. The method of manufacturing the OTFT according to claim 13, wherein the lower substrate is heated during the movement of the upper substrate.

16. The method of manufacturing the OTFT according to claim 13, wherein prior to coating the organic semiconductor solution, the method further comprising:
 modifying a surface of the lower layer with a hydrophilic material.

17. The method of manufacturing the OTFT according to claim 13, wherein prior to providing an upper substrate on the portion of the lower substrate coated with the organic semiconductor solution, the method further comprising:
 modifying the upper substrate with a hydrophobic material.

18. The method of manufacturing the OTFT according to claim 13, wherein the lower substrate comprises the gate and the gate insulating layer sequentially stacked.

19. The method of manufacturing the OTFT according to claim 13, wherein a moving velocity of the upper substrate is determined by the conditions of heating the lower substrate and a boiling point of a solvent of the organic semiconductor solution.

20. The method of manufacturing the OTFT according to claim 13, further comprising:
 sequentially stacking the gate insulating layer and the gate on the channel.

* * * * *

UNITED STATES PATENT AND TRADEMARK OFFICE
CERTIFICATE OF CORRECTION

PATENT NO. : 7,855,121 B2  
APPLICATION NO. : 12/382958  
DATED : December 21, 2010  
INVENTOR(S) : Do Hwan Kim et al.

Page 1 of 1

It is certified that error appears in the above-identified patent and that said Letters Patent is hereby corrected as shown below:

Title Page, Item (73) should read -

(73) Assignees: Samsung Electronics Co., Ltd., Gyeonggi-do (KR); The Board of Trustees of the Leland Stanford Junior University, Palo Alto, CA (US)

Signed and Sealed this  
Third Day of May, 2011

David J. Kappos  
*Director of the United States Patent and Trademark Office*